(12) United States Patent
Mok et al.

(10) Patent No.: US 7,298,223 B1
(45) Date of Patent: Nov. 20, 2007

(54) METHODS AND SYSTEMS FOR ELECTRONIC COMPONENT TEST TIME IMPROVEMENT

(75) Inventors: Stephanie Z. Mok, Sunnyvale, CA (US); Raminder Jit Singh, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 181 days.

(21) Appl. No.: 11/291,643

(22) Filed: Nov. 30, 2005

(51) Int. Cl.
*H03B 1/00* (2006.01)
*H03L 7/00* (2006.01)

(52) U.S. Cl. .......................................... 331/74; 327/142
(58) Field of Classification Search ................... 331/44, 331/60, 74, 75, 173; 327/142, 143
See application file for complete search history.

(56) References Cited

U.S. PATENT DOCUMENTS 6,873,215 B2 * 3/2005 Devries et al. ............... 331/44

* cited by examiner

*Primary Examiner*—David Mis

(57) ABSTRACT

A timer circuit that has a normal mode and a test mode is disclosed. The test mode includes a power-up phase and a power-down phase. The timer circuit includes an oscillator and a first timer circuit portion coupled to the oscillator. The first timer circuit portion includes an input and an output. An output signal that confirms either the satisfactory or unsatisfactory operation of the first timer circuit portion is taken from the output associated with the first timer circuit portion in the power-up phase. The timer circuit further includes a second timer circuit portion coupled to the first timer circuit portion and the oscillator. The second timer circuit portion also includes an input and an output. An output signal that confirms either the satisfactory or unsatisfactory operation of the second timer circuit portion is taken from the output associated with the second timer circuit portion in the power-down phase.

20 Claims, 11 Drawing Sheets

100

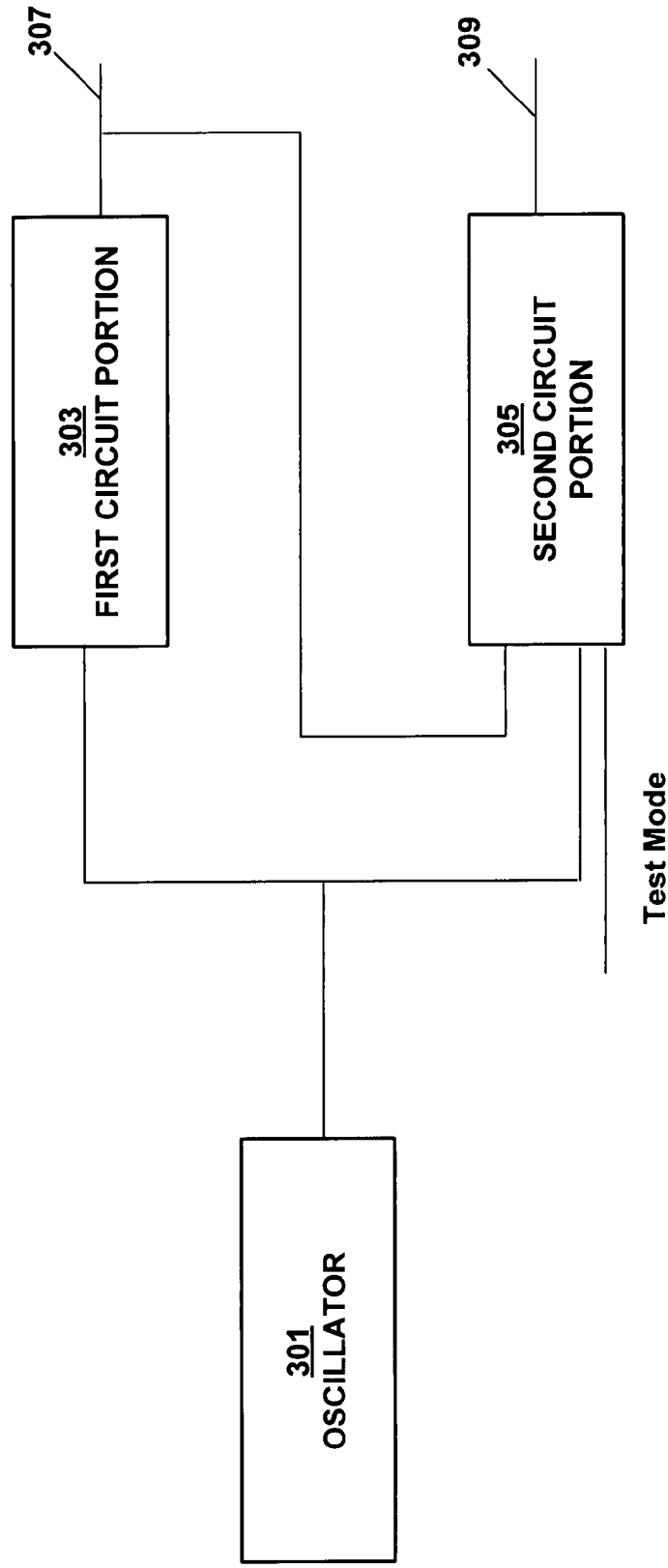

ent invention.

METHODS AND SYSTEMS FOR ELECTRONIC COMPONENT TEST TIME IMPROVEMENT

TECHNICAL FIELD

The present invention pertains to methods and systems for electronic component test time improvement.

BACKGROUND ART

Production testing involves the individual testing of large numbers of parts to determine if they function acceptably. Each test that is performed on a part exacts a cost in terms of time expenditure. The time expenditure for each part, or component of a part is multiplied over large numbers of parts and thus can be very expensive.

Production testing of integrated circuits includes the evaluation of several different integrated circuit parts. One such part that must be evaluated is the control circuit timer. Timers are used in the control circuitry of most integrated circuits, e.g., power amplifiers. A conventional timer 100 is shown in FIG. 1. Referring to FIG. 1, timer 100 divides a clock of frequency $f_0$ into a clock of frequency $f_0/2^N$ that is produced at an output of timer 100 in order to generate a delay. Such timers can be used to delay the power-up or the power-down of the power amplifier to allow noise associated with power-up and power-down to settle so as to facilitate "click-less" and "pop-less" performance.

Controlled delays provided by control circuit timers can range from milliseconds to seconds or greater. Although these wait times are beneficial as a means of facilitating click-less and pop-less performance during normal operation they add a substantial measure of time to the time that is needed to evaluate each part that is tested during the final production test. These wait times, that are expended on each part, constitute production time expenditures that are very costly in terms of time and expense. Such time consuming operation is highly undesirable in the production test environment.

SUMMARY OF THE INVENTION

Accordingly, a need exists for a method and system that can help to speed electronic component test time in the production test environment. The present invention provides a method and system that accomplishes this need.

In one embodiment, a timer circuit that has a normal mode and a test mode is disclosed. The test mode includes a power-up phase and a power-down phase. The timer circuit includes an oscillator and a first timer circuit portion coupled to the oscillator. The first timer circuit portion includes an input and an output. An output signal that confirms either the satisfactory or unsatisfactory operation of the first timer circuit portion is taken from the output associated with the first timer circuit portion in the power-up phase. The timer circuit further includes a second timer circuit portion coupled to the first timer circuit portion and the oscillator. In the test mode, the output of the oscillator is forwarded to the input of the second timer circuit portion; and in normal mode, the output of the first timer circuit portion is forwarded to the input of the second timer circuit portion. The second timer circuit portion also includes an input and an output. An output signal that confirms either the satisfactory or unsatisfactory operation of the second timer circuit portion is taken from the output associated with the second timer circuit portion in the power-down phase.

In one embodiment, respective portions of a timer circuit are tested during respective phases of a production test such that a testing of the entire timer circuit is effected in a single power-up/power-down cycle of the production test, and time expenditures related to a testing of the entire timer completely in each single phase of the production test is avoided. In one embodiment, only a first portion of the timer circuit is tested in a power-up phase of a testing cycle thereby avoiding the time expense that would be incurred by testing both a first and a second portion of the timer circuit in the power-up phase of the testing cycle. Likewise, only a second portion of the timer circuit is tested in a power-down phase of the testing cycle thereby avoiding the time expense that would be incurred by testing both the first and the second portion of the timer circuit in the power-down phase of the testing cycle. By testing only a first portion of timer circuit in the power-up phase and only a second portion of timer circuit in the power-down phase, a testing of the entire timer circuit can be effected while significant time expenditures can be avoided in each phase of the testing cycle.

These and other advantages of the present invention will no doubt become obvious to those of ordinary skill in the art after having read the following detailed description of the preferred embodiments which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

FIG. 3A shows components of timer circuit according to one embodiment of the present invention.

DETAILED DESCRIPTION OF THE INVENTION

Reference will now be made in detail to embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, the present invention may be practiced without these specific details. In other instances, well known methods, procedures, components, and circuits have not been described in detail as not to unnecessarily obscure aspects of the present invention.

Figure 1:
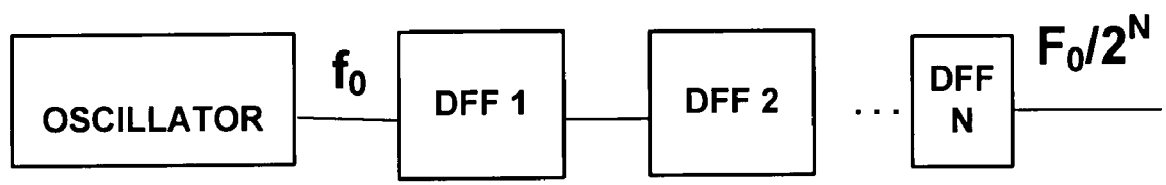
FIG. 1 shows a conventional timer according to one embodiment of the present invention.
Figure 2A:
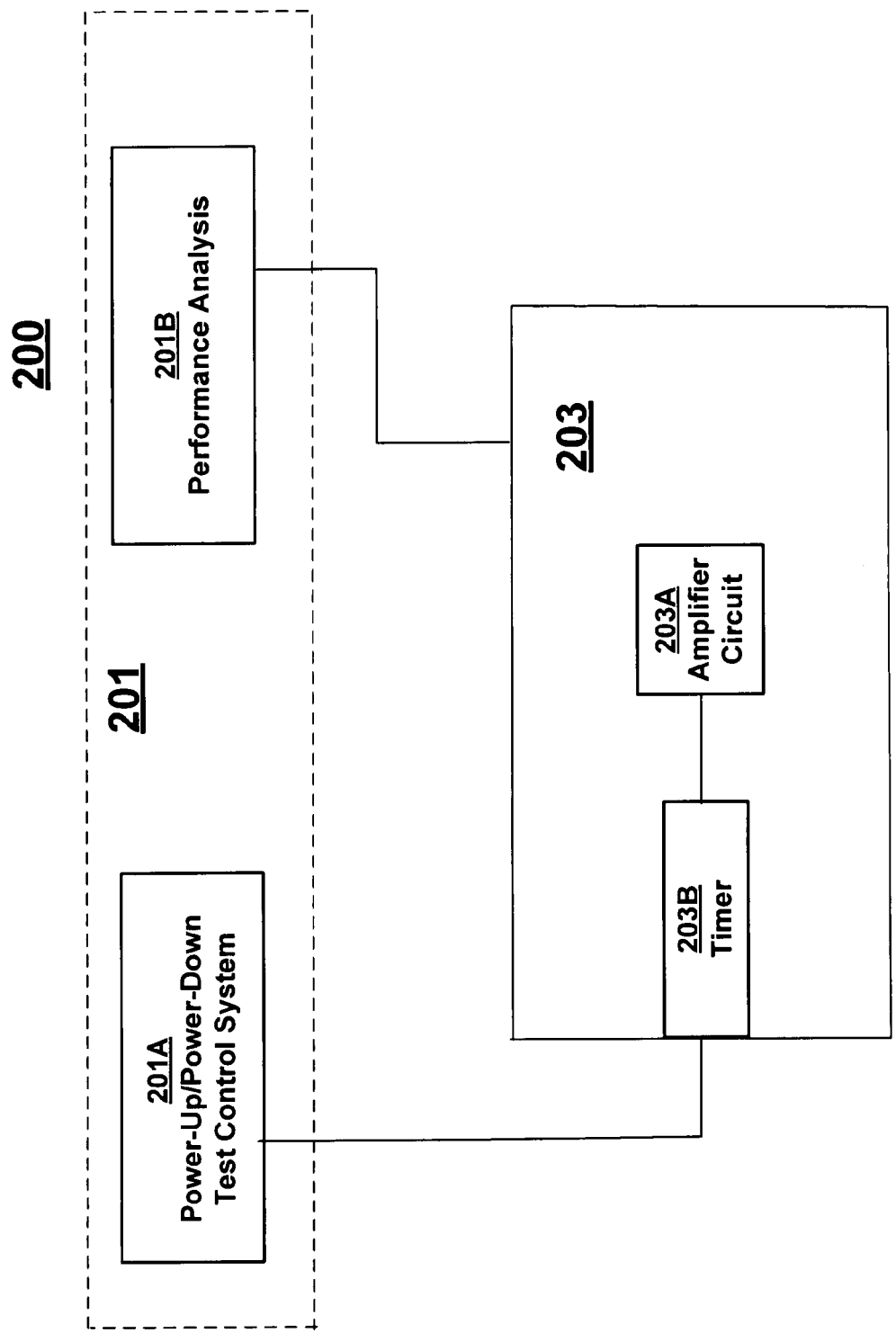
FIG. 2A is a block diagram of a system for testing the operation of a timer circuit of a power amplifier according to one embodiment of the present invention.

System for Electronic Component Test Time Improvement in Accordance with Embodiments of the Present Invention FIG. 2A is a block diagram 200 of a system for testing the operation of a timer circuit of an electronic component (e.g., power amplifier 203) according to one embodiment of the present invention. In one embodiment, respective portions of a timer circuit 203B are tested during respective phases of a production test such that a testing of the entire timer circuit is effected in a single power-up/power-down cycle of the production test, and time expenditures related to a testing of the entire timer completely in each single phase of the production test is avoided. In one embodiment, testing system 201 tests only a first portion of timer circuit 203B in a power-up phase of a testing cycle thereby avoiding the time expense that would be incurred by testing both a first and a second portion of timer circuit 203B in the power-up phase of the testing cycle. Likewise, testing system tests only a second portion of timer circuit 203B in a power-down phase of the testing cycle thereby avoiding the time expense that would be incurred by testing both the first and the second portion of timer circuit 203B in the power-down phase of the testing cycle. By testing only a first portion of timer circuit 203B in the startup phase and only a second portion of timer circuit 203B in the power-down phase, a testing of the entire timer circuit can be effected while significant time expenditures can be avoided in each phase of the testing cycle. It should be appreciated that since the value of the supply current in the power-down phase is an extremely important specification of battery powered electronic systems and need to be tested, allocating the testing of parts of timer circuit 203B between power-up and power-down phases is convenient as it is accommodated by test phases that are already a part of existing production test processes.

In the FIG. 2A embodiment, power amplifier 203 includes amplifier circuit 203A and timer circuit 203B. Referring to FIG. 2A, power-up/power-down test control system 201A is employed to trigger the powering up and powering down of power amplifier 203. And, performance analysis system 201B receives outputs from timer circuit 203B that can be used to confirm the acceptable function of timer circuit 203B. In one embodiment, in a power-up phase of testing the timer circuit 203B output is taken from a first output that corresponds to a first portion of the timer circuit, and, in a power-down phase of testing, the timer circuit 203B output is taken from a second output that corresponds to another portion of timer circuit 203B as is discussed in detail below with reference to FIG. 3A.

As is illustrated in FIG. 2A, power amplifier 203 is tested by testing system 201 to determine if power amplifier 203 meets acceptable performance standards. In one embodiment, the performance of power amplifier 203 is assessed during both power-up and power-down phases of a test cycle. As a part of such testing, the performance of various components of power amplifier 203, such as timer circuit 203B are tested, as is discussed in detail herein.

In one embodiment, power amplifier 203 can be packaged in a commercial integrated circuit package arrangement and does not require the use of additional pins (to trigger testing of timer circuit 203B). It should be appreciated that during production testing, existing power amplifier input and output pins can be used to initiate the power-up and power-down phases of the test and to obtain desired output signals. In one embodiment, power amplifier 203 can be operated in both test and normal modes. In test mode, the power-up and power-down delays are provided by either a first or a second portion of timer circuit 203B (but not both) and thus are abridged. By contrast, in normal mode, the power-up and power-down delays are provided by both portions of timer circuit 203B and thus the full delay of timer circuit 203B is generated. In the FIG. 2A embodiment, power amplifier 203 includes amplifier circuit 203A and timer circuit 203B.

In one embodiment, timer circuit 203B can be a part of the control circuit of power amplifier 203. Moreover, timer circuit 203B can be employed to generate a delay that can minimize or eliminate audible noise (e.g., pop) by delaying power-up or power-down cycles. In one embodiment, the timer has two modes of operation: (1) test mode and (2) normal mode. In test mode a generated delay is provided by only a portion of timer circuit 203B and thus the delay is abridged. In normal mode delay is provided by the entire timer circuit 203B and thus is longer. In production test it is advantageous to avoid the longer delay that is generated by timer circuit 203B in normal mode.

In one embodiment, timer circuit 203B has two distinct portions, and outputs that correspond to each portion (see discussion made with reference to FIG. 3A). In test mode, upon power-up an output that provides an indication of the proper function of the first portion of timing circuit 203B is taken from a first output that is associated with the first portion of timing circuit 203B. And, upon powering down, an output that provides an indication of the proper function of the second portion of timing circuit 203B is taken from the second output that is associated with the second portion of timer circuit 203B.

Figure 2B:
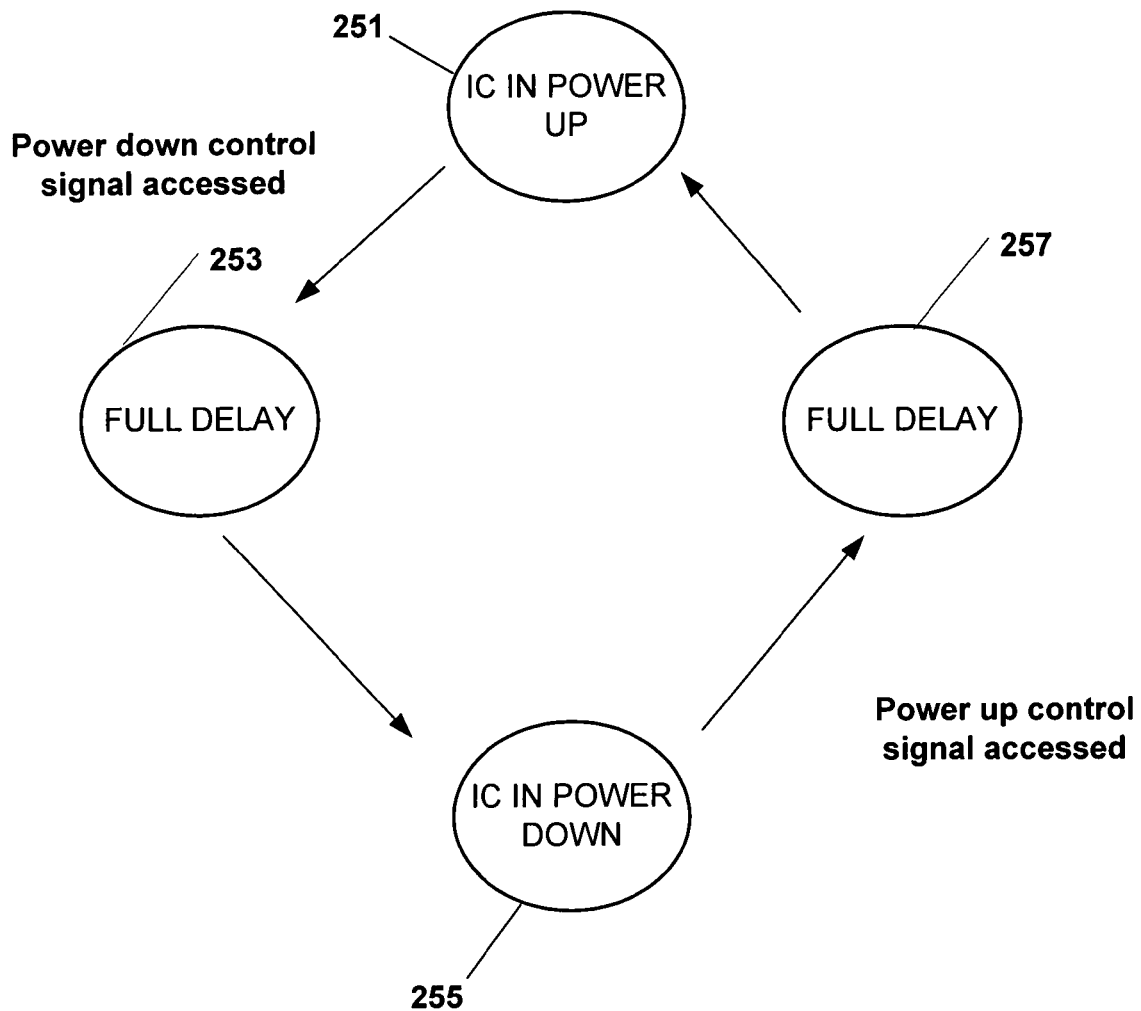
FIG. 2B illustrates the operation of a timer circuit in normal mode according to one embodiment of the present invention.
Figure 2C:
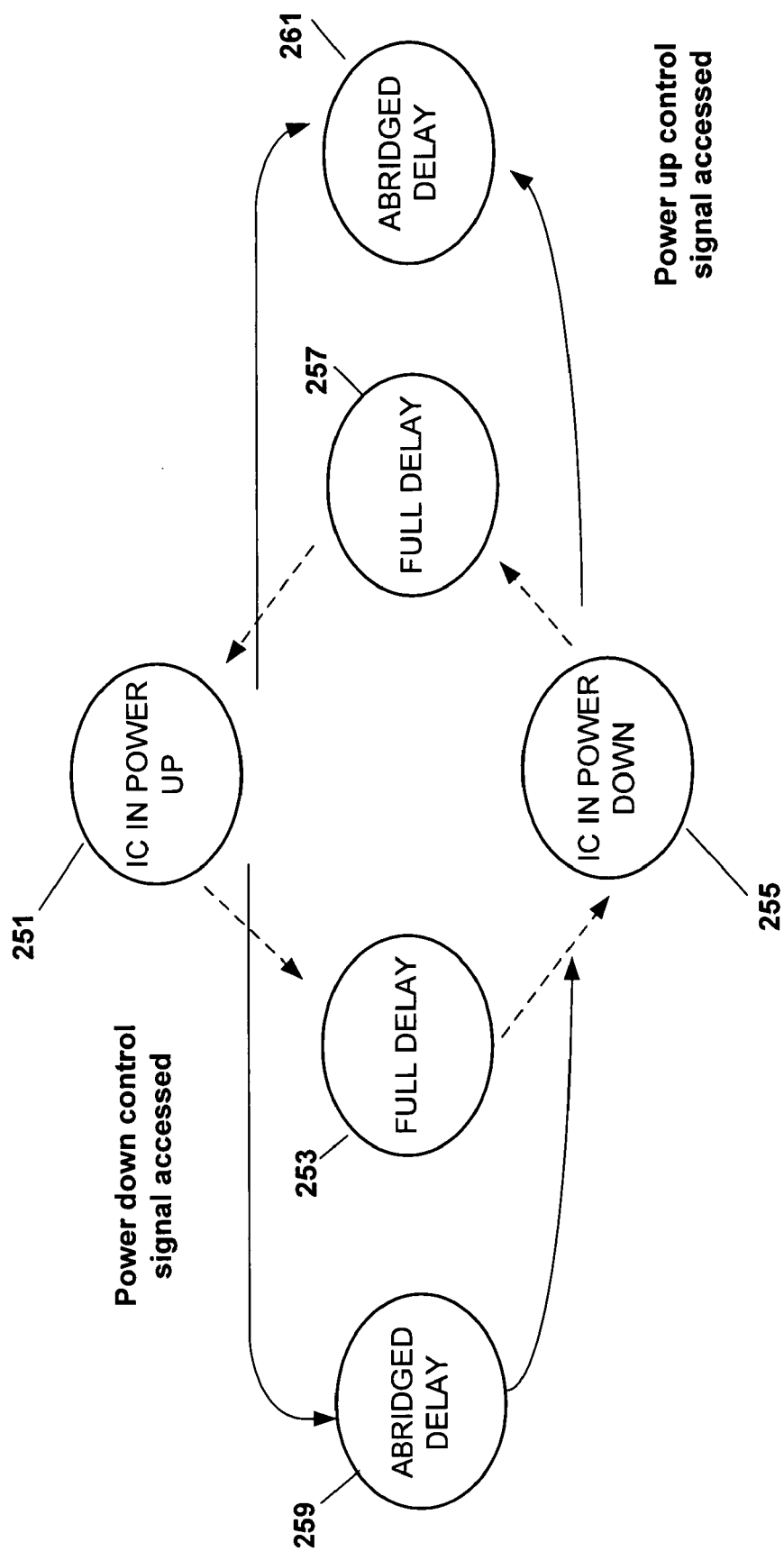
FIG. 2C illustrates the operation of a timer circuit in test mode according to one embodiment of the present invention.

FIGS. 2B and 2C are diagrams that illustrate the operation of timer circuit 203B in normal and test mode respectively according to one embodiment of the present invention. FIG. 2B illustrates the operation of timer circuit 203B in normal mode. Referring to FIG. 2B, starting from a power-up state 251, when the power amplifier is prompted to shutdown in normal mode, a timer circuit, e.g., 203B in FIG. 2A, causes the actual shutdown of the power amplifier to be delayed, for instance, by 1 second, shown at state 253, which is the full delay provided by the timer circuit, e.g., 203B in FIG. 2A. Thereafter, power amplifier is powered-down at state 255. Subsequently, when the power amplifier is prompted to power-up, a timer circuit, e.g., 203B in FIG. 2A causes delay to the full functionality of the power amplifier, for instance, by 1 second, as shown at state 257. Thereafter, power amplifier, e.g., 203 in FIG. 2A is powered-up at state 251.

FIG. 2C illustrates the operation of timer circuit 203B in test mode. Referring to FIG. 2C, starting from a power-up state 251, when the power amplifier is prompted to shut-down, timer circuit 203B is prompted to forego the normal mode full delay (e.g., 1 second in the FIG. 2B example above), at 253, and to cause a shorter delay as is shown at 259, for instance 20 ms. Thereafter, power amplifier 203 is powered down at state 255. Subsequently, when the power amplifier 203 is prompted to power-up, the timer circuit 203B is prompted to again forego the normal mode full delay, at 257, and to cause a shorter delay, for instance 40 ms, as is shown at 261. Thereafter, the power amplifier 203 is powered up at state 251.

In one embodiment, the timer circuit can be implemented as a part of a programmable circuit. In such embodiments, the length of the delays that are discussed above with reference to FIGS. 2B and 2C can be programmed and changed.

FIG. 3A shows components of an exemplary timer circuit 203B according to one embodiment of the present invention. In exemplary embodiments, timer circuit 203B can be included as a part of the control circuit of power amplifier 203 as is discussed above. In one embodiment, timer circuit 203B can be employed to generate a delay that can minimize or eliminate audible noise (e.g., pop) associated with power-up and power-down of a device such as a power amplifier by delaying power-up or power-down. During a production test both power-up and power-down operations of timer circuit 203B are tested, and thus the power-up and power-down delays can add significant time to testing operations.

In exemplary embodiments of the present invention, test mode delay is provided in the power-up and power-down phases of the production test by respective portions of timer circuit 203B. Thus, in test mode, the generated delay is shortened or abridged for both the power-up phase and the power-down phase of the testing of timer circuit 203B as is discussed herein. In a production test that involves tens of thousands of power amplifiers that need to be powered up and down, the time, and cost savings realized due to the shortened delay effected in the power-up and power-down phases can be very significant.

It is important to note that, using the methodology described herein a complete testing of timer circuit 203B can be effected since the acceptable operation of the first portion of timer circuit 203B can be confirmed during the power-up phase of the production test and the acceptable operation of the second portion of timer circuit 203B can be confirmed during the power-down phase of the production test. In the FIG. 3A embodiment, timer circuit 203B includes oscillator 301, first circuit portion 303, second circuit portion 305, first output 307 and second output 309.

Oscillator 301 generates a clock signal (a series of pulses) that paces the operation of timing circuit 203B. More specifically, oscillator 301 generates a clock signal that synchronizes, paces and coordinates the operations of timing circuit 203B. In one embodiment, the clock signal is a repetitive electronic pulse.

First circuit portion 303 includes a first branch of timing circuit 203B. In one embodiment, the first circuit portion can be implemented with clock or frequency dividing components. It should be appreciated that in test mode, upon power-up the timing circuit output is taken from a first output 307 that is associated with the first circuit portion of timing circuit 203B.

Second circuit portion 305 includes a second branch of timing circuit 203B. In one embodiment, as with the first circuit portion discussed above, the second circuit portion can be implemented with clock or frequency dividing components. The input of second circuit portion 305 is coupled to the output 307 of first circuit portion 303 and the output of oscillator 301. In normal mode, a timer output with full delay can be produced at the output 309 of second circuit portion 305 with the clock input to second circuit portion 305 taken from output 307. It should be appreciated that in test mode, upon power-down, the timing circuit output can be taken from second output 309 that is associated with the second portion of timing circuit 203B.

Figure 3B:
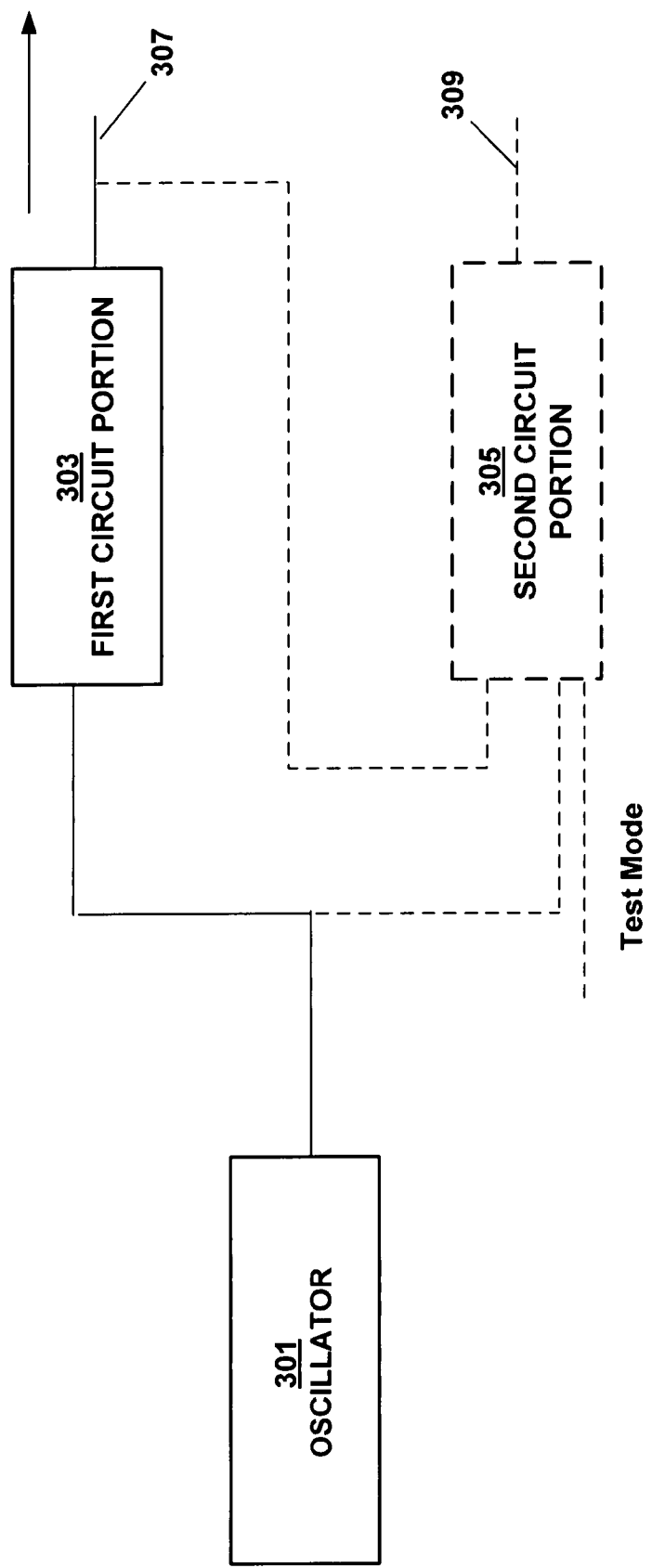
FIG. 3B illustrates aspects of the functionality of timer circuit according to one embodiment of the present invention.
Figure 3C:
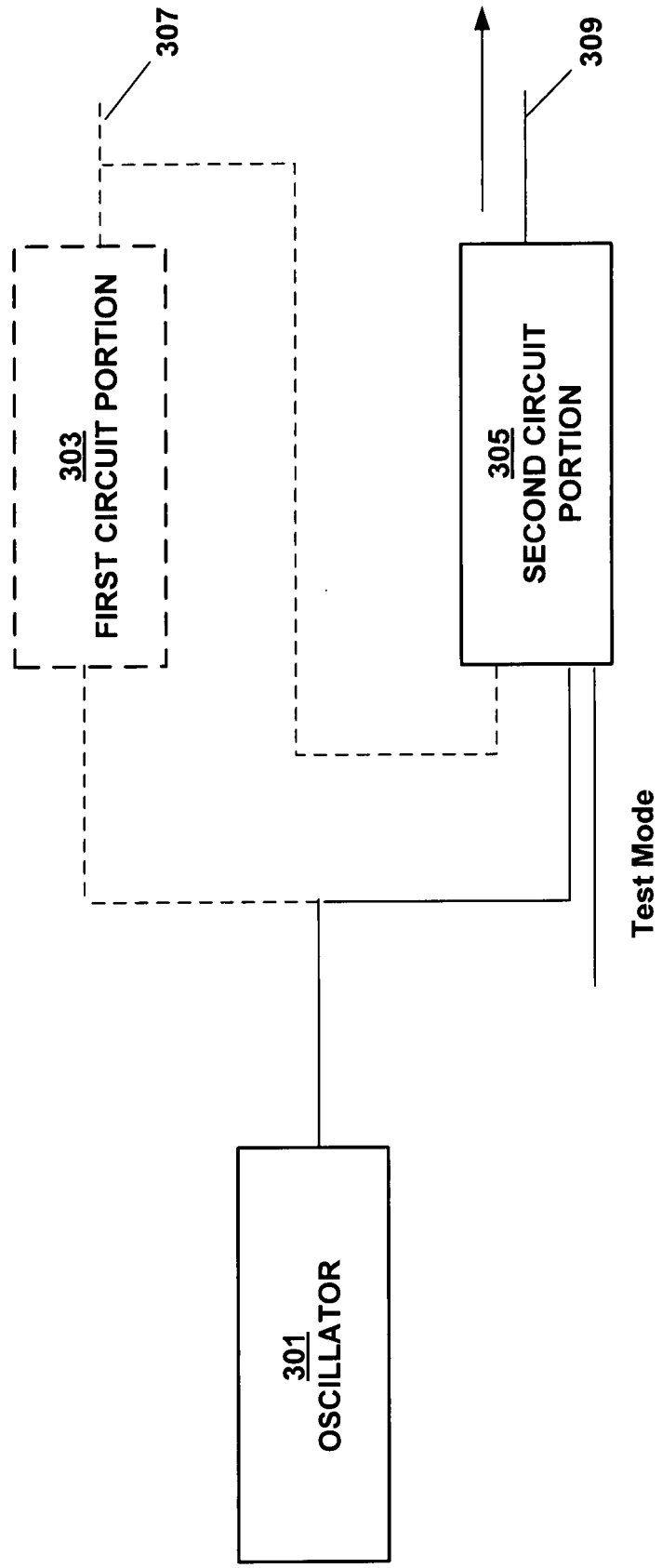
FIG. 3C illustrates aspects of the functionality of timer circuit according to one embodiment of the present invention.
Figure 3D:
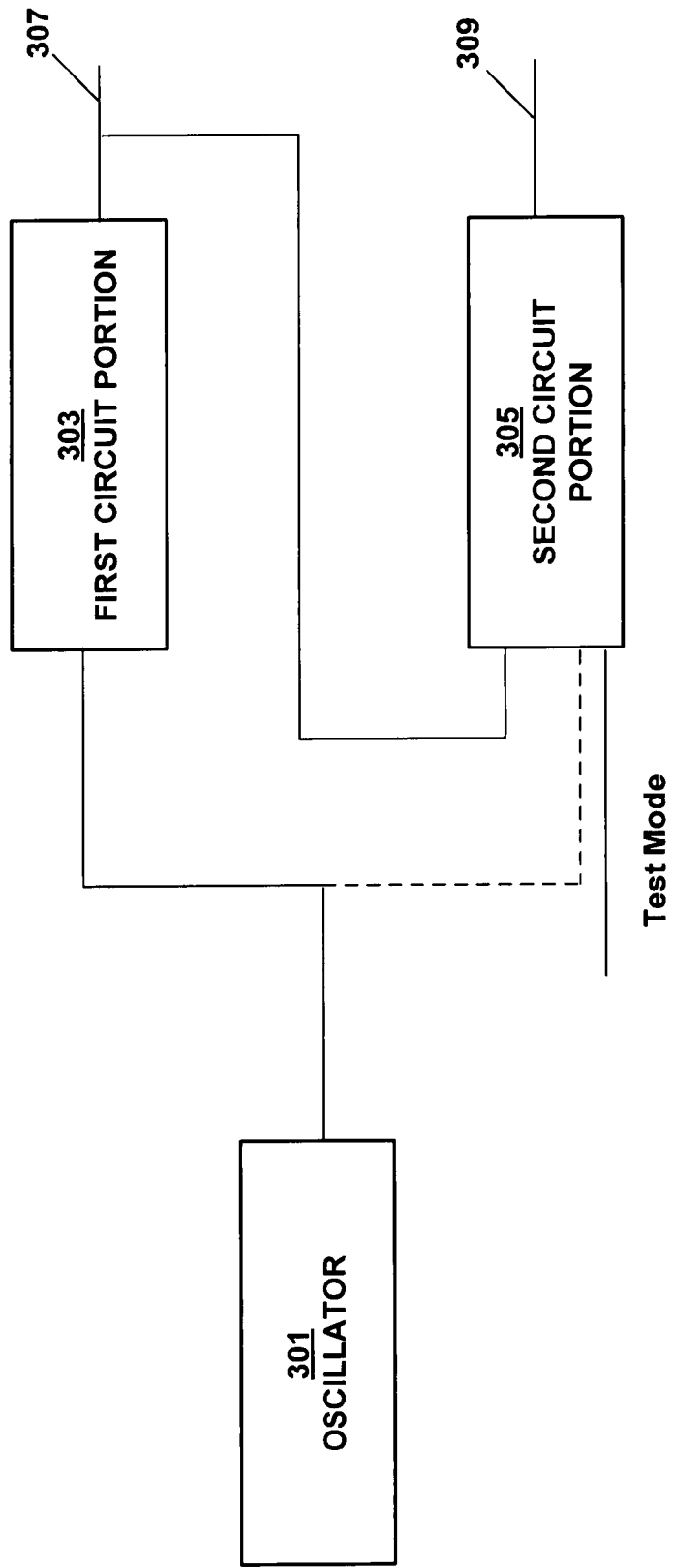
FIG. 3D illustrates aspects of the functionality of timer circuit according to one embodiment of the present invention.

FIGS. 3B, 3C and 3D illustrate aspects of the functionality of timer circuit 203B. In operation, in one embodiment, during a power-up phase, the output is taken from an output 307 associated with the first circuit portion 303 as is shown in FIG. 3B. It should be appreciated that in one embodiment, in a power-up phase, the number of frequency dividing components that are included in the signal path to the output associated with first circuit portion 303 can be less than the number of frequency dividing components that are included in the signal path to the output 309 associated with second circuit portion 305. Alternately, in a power-down phase the output is taken from an output 309 associated with the second circuit portion 305 as is shown in FIG. 3C. It should be appreciated that in one embodiment, in a power-down phase, the number of frequency dividing components that are included in the signal path to the output 309 associated with second circuit portion 305 can be less than the number of frequency dividing components that are included in the signal path to the output 307 associated with the first circuit portion. Finally, in normal mode, the input of second timer circuit portion 305 is coupled to the output 307. The output of timer 203B is taken from output 309 associated with both the first and second timer circuit 303 and 305 as shown in FIG. 3D. In this mode the length of the delay is based on components (e.g., frequency dividing components) of both the first and second circuit portions, 303 and 305. Thus, the number of frequency dividing components that are included in the signal path to output 309 during normal mode is greater than the number of frequency dividing components included in the signal path during test mode.

In one embodiment, the first portion of the timing circuit and the second portion of the timing circuit can include a plurality of flip flops. In addition, in one embodiment, the first portion of the timing circuit and the second portion of timing circuit can include a multiplexer. In other embodiments, other components can be employed in the first and second portions of the timing circuit.

Figure 4A:
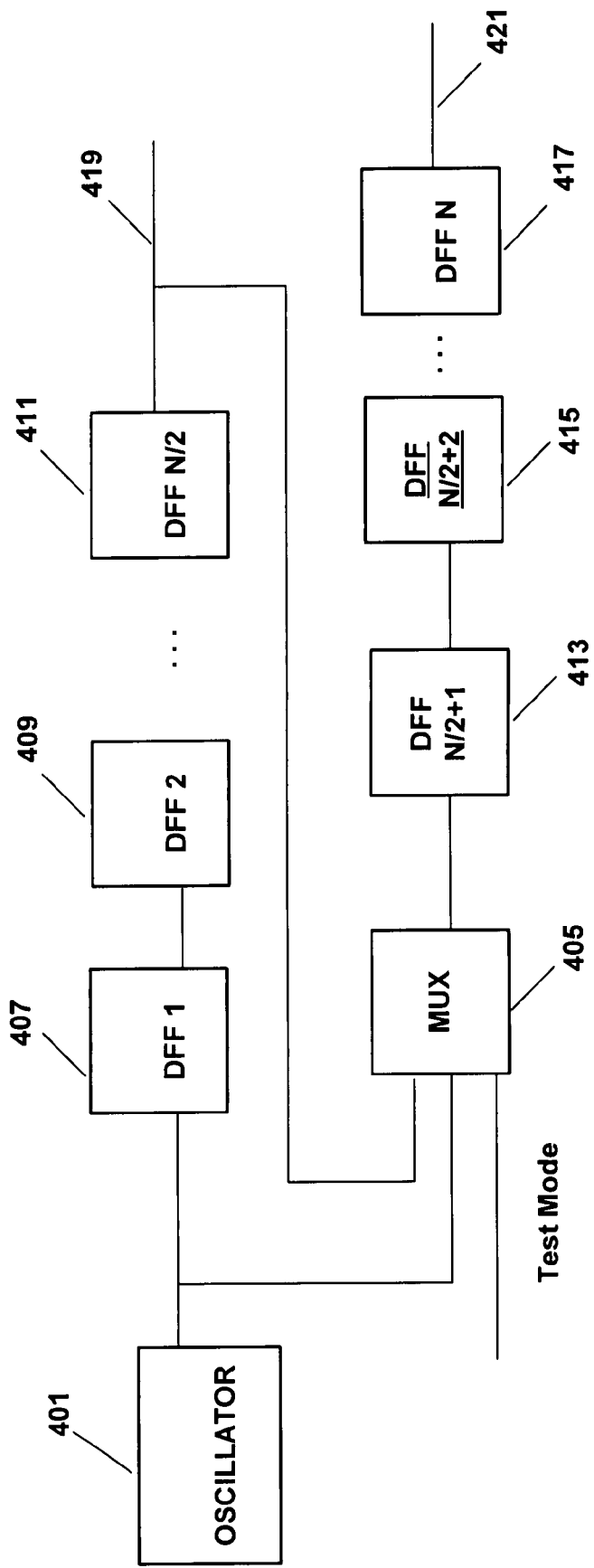
FIG. 4A shows an exemplary implementation of timing circuit according to one embodiment of the present invention.

FIG. 4A shows an exemplary implementation of timing circuit 400 according to one embodiment of the present invention. In the FIG. 4A embodiment, timing circuit 400 includes oscillator 401, multiplexer 405, D Flip Flops 1-N 407-417, output 1 419 and output 2 421.

Oscillator 401 generates a clock signal (a series of pulses) that paces the operation of timing circuit 400. More specifically, oscillator 401 generates a clock signal that synchronizes, paces and coordinates the operations of timing circuit 400. In one embodiment, the clock signal is a repetitive electronic pulse.

D Flip-Flops 1-N, 407-417 are bistable gates that are organized to function as a clock divider. In one embodiment, the clock divider constituted thereby divides the frequency of the clock signal that is generated by oscillator 401 by a prescribed amount. In the FIG. 4A embodiment, D Flip Flops 1-N 407-417 are associated with first and second branches of timing circuit 403. In the FIG. 4A embodiment, the first branch includes D Flip Flops 407, 409 to 411. And, the second branch includes D Flip Flops 413, 415 to 417. It should be appreciated that output 1 419 is associated with the first branch and output 2 421 is associated with the second branch.

In operation, timing circuit 400 runs in two modes: (1) test mode and (2) normal mode. In one embodiment, upon powering-up, or coming out of a shutdown phase, the timing circuit output in test mode is taken from output 1 419. It should be appreciated that the clock signal is divided by the D Flip Flops in the order of DFF1, DFF2, . . . DFFN/2. Consequently, the signal that is provided at output 1 419 (for confirmation of the acceptable function of DFF1-DFFN/2) is provided in a shorter period of time than is the signal that is provided at output 2 421 if the input of multiplexer 405 is taken from output 419.

In one embodiment, upon powering-down, or coming out of the power-up phase, the timing circuit 400 output in test mode is taken from output 1 421 with multiplexer 405 input taken from output of the oscillator 401. It should be appreciated that the clock signal is divided by the DFF in the order of DFFN/2+1, DFFN/2+2 . . . DFFN. Similar to the power-up phase, the signal that is provided at output 2 421 (for confirmation of the acceptable function of DFFN/2+1-DFFN) is provided in a shorter period of time.

It should be appreciated that, for all power-up, power-down operations in normal mode, the timer circuit output is taken from output 421, with the multiplexer 405 input taken from output 419.

Figure 4B:
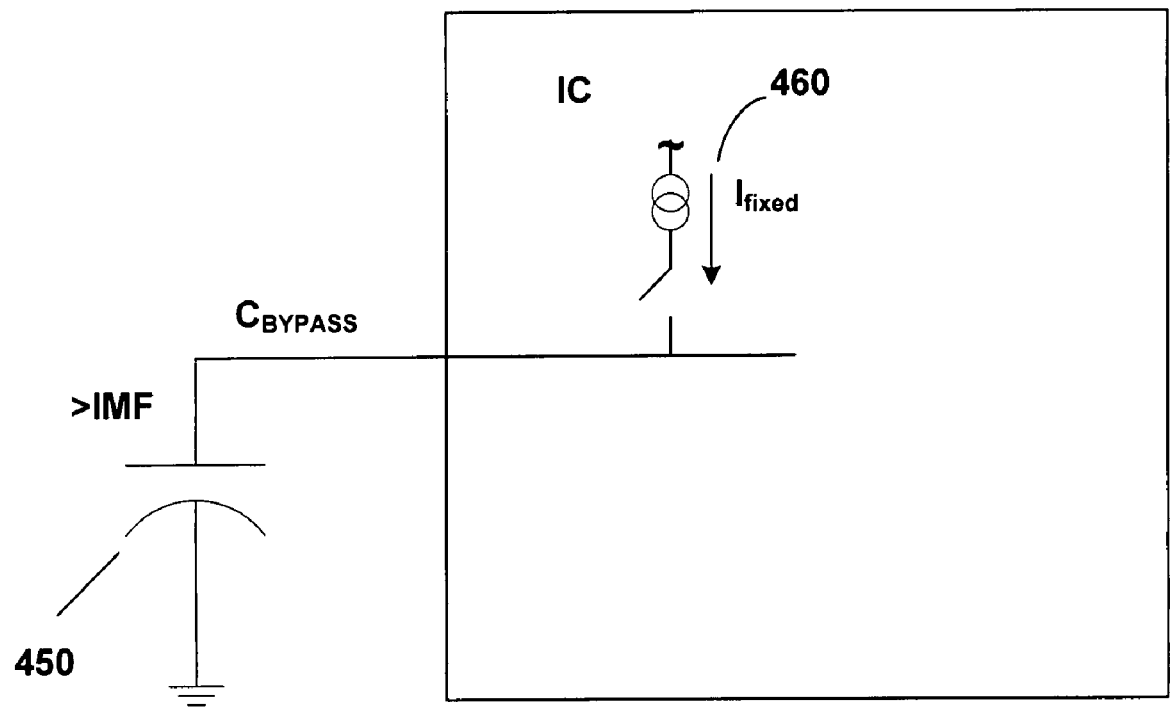
FIG. 4B shows an a bypass capacitor that can be used to initiate test mode according to one embodiment of the present invention.

In one embodiment, the above test enables the testing of all of the elements in the timer chain during the two phases of test mode. In one embodiment, normal mode and test mode can be initiated through the use of an external bypass capacitor 450 as is shown in FIG. 4B. Such capacitors are commonly used in power amplifier design as a means of filtering noise. In one embodiment, internally or externally generated current source 460 with fixed or varying current value can be used to charge up the capacitor. In one embodiment, in test mode a smaller capacitance than is employed in normal mode is used to trigger the entry into test mode at shortened intervals. In one embodiment, when the capacitor is detected as fully charged faster than a certain time amount, test mode is initiated.

Figure 5:
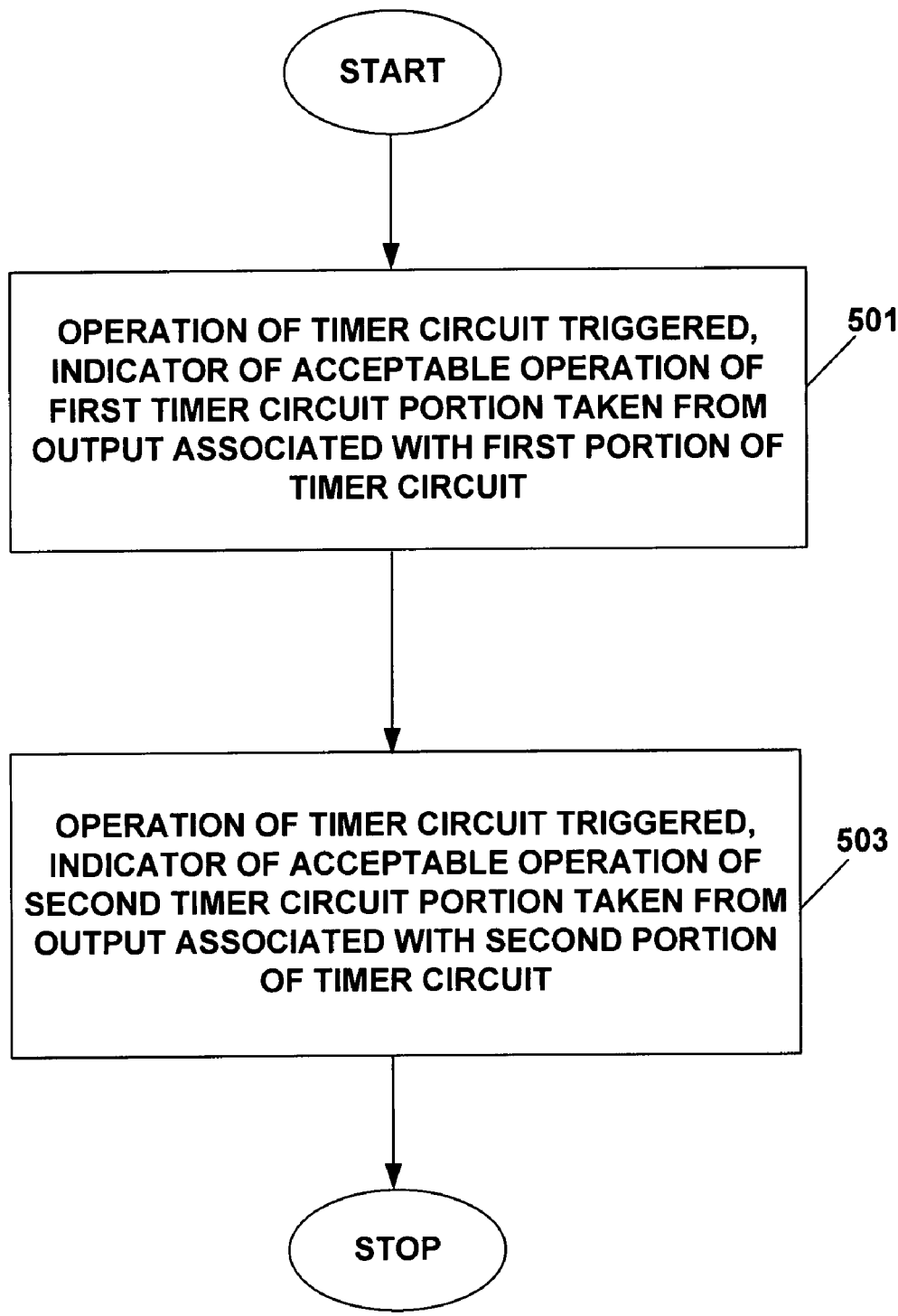
FIG. 5 shows the steps performed in a method for testing a timing circuit that comprises power-up and power-down phases according to one embodiment of the present invention.

FIG. 5 shows the steps performed in a method for testing a timing circuit that comprises power-up and power-down phases according to one embodiment of the present invention. It should be appreciated that FIG. 5 details operations that can be performed during production test of electronic components (e.g., amplifiers etc.) that contain a timing circuit as a part of its control circuitry.

At step 501, the operation of a timing circuit that includes first and second portions is triggered during a power-up phase of a test of the timing circuit. In one embodiment, an output indicator of satisfactory/unsatisfactory operation of the first portion of the timing circuit is taken from an output associated with the first portion of the timing circuit. In one embodiment, during the power-up phase of a test of the timing circuit, the timing of the output is based only on components of the first portion of the timing circuit and not on components of the second portion of the timer circuit.

At step 503, the operation of the timing circuit that includes first and second portions is triggered during the power-down phase of a test of the timing circuit. In one embodiment, an output indicator of the satisfactory/unsatisfactory operation of the second portion of the timing circuit is taken from and output associated with the second portion of the timing circuit. In one embodiment, during the power-down phase of a test of the timing circuit, the timing of the output is based only on components of the second portion of the timing circuit and not on components of the first portion of the timer circuit.

With reference to exemplary embodiments thereof, a timer circuit that has a normal mode and a test mode is disclosed. The test mode includes a power-up phase and a power-down phase. The timer circuit includes an oscillator and a first timer circuit portion coupled to the oscillator. The first timer circuit portion includes an input and an output. An output signal that confirms either the satisfactory or unsatisfactory operation of the first timer circuit portion is taken from the output associated with the first timer circuit portion in the power-up phase. The timer circuit further includes a second timer circuit portion coupled to the first timer circuit portion and the oscillator. The second timer circuit portion also includes an input and an output. An output signal that confirms either the satisfactory or unsatisfactory operation of the second timer circuit portion is taken from the output associated with the second timer circuit portion in the power-down phase.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A timer circuit having a normal mode and a test mode, said normal mode and said test mode including a power-up phase and a power-down phase, said timer circuit comprising:
   an oscillator;
   a first timer circuit portion, coupled to said oscillator, wherein an output signal that confirms either the satisfactory or unsatisfactory operation of said first timer circuit portion is taken from an output associated with said first timer circuit portion during said power-up phase of said test mode, and
   a second timer circuit portion, coupled to said first timer circuit portion and said oscillator, wherein an output signal that confirms either the satisfactory or unsatisfactory operation of said second timer circuit portion is taken from the output associated with said second timer circuit portion during said power-down phase of said test mode.

2. The timer circuit of claim 1 wherein in said normal mode components of both said first timer circuit portion and said second timer portion contribute to a delay that is provided by said timer circuit.

3. The timer circuit of claim 1 wherein in said test mode components of either said first timer circuit portion only or said second timer portion only contribute to a delay provided by said timer circuit.

4. The timer circuit of claim 1 wherein an external bypass capacitor is used to trigger a change from said normal mode to said test mode.

5. The timer circuit of claim 2 wherein an internally or externally generated current is used to charge said bypass capacitor.

6. The timer circuit of claim 1 wherein said timing circuit is included in control circuitry for a power amplifier.

7. The timer circuit of claim 1 wherein a delay that is generated by said timing circuit is programmable.

8. An integrated circuit, comprising:
   an input;
   an electronic circuit coupled to said input,
   a timer circuit coupled to said electronic circuit; and
   an output;
   wherein said timer circuit, comprises:
      an oscillator;
      a first timer circuit portion, coupled to said oscillator, wherein an output signal that confirms either the satisfactory or unsatisfactory operation of said first timer circuit portion is taken from an output associated with said first timer circuit portion during a power-up phase of a test mode, and
      a second timer circuit portion, coupled to said first timer circuit portion and said oscillator, wherein an output signal that confirms either the satisfactory or unsatisfactory operation of said second timer circuit portion is taken from the output associated with said second timer circuit portion during a power-down phase of said test mode.

9. The integrated circuit of claim 8 wherein in a normal mode components of both said first timer circuit portion and said second timer portion contribute to a delay that is provided by said timer circuit.

10. The integrated circuit of claim 8 wherein in said test mode components of either said first timer circuit portion only or said second timer portion only contribute to a delay provided by said timer circuit.

11. The integrated circuit of claim 8 wherein an external bypass capacitor is used to trigger a change from said normal mode to said test mode.

12. The integrated circuit of claim 9 wherein an internally or externally generated current is used to charge said bypass capacitor.

13. The integrated circuit of claim 8 wherein a delay that is generated by said timing circuit is programmable.

14. The integrated circuit of claim 8 wherein said output is taken from a pin of an integrated circuit package.

15. A method for testing a timer circuit having a normal mode and a test mode, said normal mode and said test mode including a power-up and a power-down phase, comprising:
   triggering the operation of said timer circuit during said power-up phase, wherein an output that indicates either a satisfactory or an unsatisfactory operation of a first portion of said timer circuit is taken from an output associated with said first portion of said timer circuit during said test mode; and
   triggering the operation of said timer circuit during said power-down phase, wherein an output that indicates either a satisfactory or an unsatisfactory operation of a second portion of said timer circuit is taken from an output associated with said second portion of said timer circuit during said test mode.

16. The method of claim 15 wherein in said normal mode components of both said first portion of said timer circuit and said second portion of said timer circuit contribute to a delay that is provided by said timer circuit.

17. The timer circuit of claim 15 wherein in said test mode components of either said first portion of said second portion of said timer circuit only contribute to a delay that is provided by said timer circuit.

18. The method of claim 15 wherein an external bypass capacitor is used to trigger a change from said normal mode to said test mode.

19. The method of claim 18 wherein an internally or externally generated current is used to charge said external bypass capacitor.

20. The method of claim 15 wherein said timer circuit is included in control circuitry of an integrated circuit.

* * * * *